US011709210B2

(12) United States Patent
Yoshida et al.

(10) Patent No.: US 11,709,210 B2
(45) Date of Patent: Jul. 25, 2023

(54) INTERLOCK DEVICE FOR HIGH VOLTAGE APPARATUS

(71) Applicant: SANDEN AUTOMOTIVE COMPONENTS CORPORATION, Isesaki (JP)

(72) Inventors: Hiroshi Yoshida, Isesaki (JP); Yunhai Jin, Isesaki (JP)

(73) Assignee: SANDEN CORPORATION, Isesaki (JP)

( * ) Notice: Subject to any disclaimer, the term of this patent is extended or adjusted under 35 U.S.C. 154(b) by 328 days.

(21) Appl. No.: 17/275,894

(22) PCT Filed: Feb. 14, 2020

(86) PCT No.: PCT/JP2020/005715
§ 371 (c)(1),
(2) Date: Mar. 12, 2021

(87) PCT Pub. No.: WO2020/179403
PCT Pub. Date: Sep. 10, 2020

(65) Prior Publication Data
US 2021/0263113 A1 Aug. 26, 2021

(30) Foreign Application Priority Data
Mar. 6, 2019 (JP) ................................. 2019-040760

(51) Int. Cl.
*G01R 31/66* (2020.01)
*B60L 1/00* (2006.01)
(Continued)

(52) U.S. Cl.
CPC ................ *G01R 31/66* (2020.01); *B60L 1/00* (2013.01); *B60L 3/12* (2013.01); *H01H 9/226* (2013.01); *B60H 1/00428* (2013.01)

(58) Field of Classification Search
CPC .. G01R 19/0092; G01R 15/08; H01L 27/0207
See application file for complete search history.

(56) References Cited

U.S. PATENT DOCUMENTS

2003/0158640 A1* 8/2003 Pillar .................... G01M 17/00
701/29.4
2004/0000909 A1* 1/2004 Kablaoui .............. B60L 3/0023
324/326
(Continued)

FOREIGN PATENT DOCUMENTS

JP 2009-077627 A 4/2009
JP 2014-011959 A 1/2014
JP 2019-051790 A 4/2019

OTHER PUBLICATIONS

Japan Patent Office, International Search Report issued in International Application No. PCT/JP2020/005715, dated Apr. 28, 2020.

*Primary Examiner* — Akm Zakaria
(74) *Attorney, Agent, or Firm* — Baker Botts L.L.P.

(57) ABSTRACT

Provided is an interlock device for a high voltage apparatus which enables not only the diagnosis of the connected or non-connected state of a connector during normal operation of the interlock device, but also the detection of a failure of the interlock device itself, including a failure of the interlock loop. The device includes an interlock loop 16 annexed to an HV connector 7 for connecting an electric compressor to an HV battery 8, a detecting signal output unit, a first switching element, a controlling voltage switching circuit operable, in a closed state of the interlock loop, to switch a voltage applied to a control electrode of the first switching element according to an output of the detecting signal output unit, a second switching element operable, in an open state of the interlock loop, to apply to the control electrode of the first switching element an output of the controlling voltage switching circuit so as to cause an ON/OFF state of the first (Continued)

switching element to be inverted from when the interlock loop is in the closed state, and a failure diagnosis unit.

16 Claims, 3 Drawing Sheets

(51) Int. Cl.
*B60L 3/12* (2006.01)
*H01H 9/22* (2006.01)
*B60H 1/00* (2006.01)

(56) References Cited

U.S. PATENT DOCUMENTS

| | | |
|---|---|---|
| 2013/0106171 A1 | 5/2013 | Ferrel |
| 2015/0224881 A1* | 8/2015 | Deyda .................. B60L 3/0015 |
| | | 701/29.2 |
| 2016/0214485 A1* | 7/2016 | Butzmann ............. B60L 3/0046 |
| 2017/0292982 A1 | 10/2017 | Acena et al. |
| 2020/0094682 A1* | 3/2020 | Zeng ....................... G01R 31/54 |
| 2022/0009351 A1* | 1/2022 | Fu .......................... G01R 31/52 |
| 2022/0011762 A1* | 1/2022 | Li ....................... G01R 31/3275 |
| 2022/0043045 A1* | 2/2022 | Edelhauser ............... B60L 3/04 |

* cited by examiner

FIG. 3

| No. | STATE OF INTERLOCK LOOP OR CIRCUIT | OUTPUT SIGNAL | THIRD SWITCHING ELEMENT 32 | OPTICAL COUPLER 34 | SECOND SWITCHING ELEMENT BASE VOLTAGE | SECOND SWITCHING ELEMENT 29 | FIRST SWITCHING ELEMENT BASE VOLTAGE | FIRST SWITCHING ELEMENT 28 | OPTICAL COUPLER 41 | INPUT SIGNAL | DIAGNOSIS |
|---|---|---|---|---|---|---|---|---|---|---|---|
| (1) | INTERLOCK LOOP: CLOSED STATE | L | OFF | OFF | <Vin(ON) | ON | >Vin(ON) | ON | ON | L | HV CONNECTOR CONNECTED |
|  |  | H | ON | ON | <Vin(ON) | ON | <Vin(ON) | OFF | OFF | H |  |
| (2) | INTERLOCK LOOP: OPEN STATE | L | OFF | OFF | >Vin(ON) | OFF | <Vin(ON) | OFF | OFF | H | HV CONNECTOR DISCONNECTED |
|  |  | H | ON | ON | <Vin(ON) | ON | >Vin(ON) | ON | ON | L |  |
| (3) | INTERLOCK LOOP: CLOSED POWER SHORT CIRCUIT STATE | L | OFF | OFF | LV5V | OFF | LV5V | ON | ON | L | POWER SHORT CIRCUIT OR FAILURE |
|  |  | H | ON | ON | LV5V | OFF | LV5V | ON | ON | L |  |
| (4) | INTERLOCK LOOP: CLOSED GROUND SHORT CIRCUIT STATE | L | OFF | OFF | LV GND | ON | LV GND | OFF | OFF | H | GROUND SHORT CIRCUIT OR FAILURE |
|  |  | H | ON | ON | LV GND | ON | LV GND | OFF | OFF | H |  |
| (5) | CIRCUIT FAILURE EXAMPLE: FIRST SWITCHING ELEMENT OUTPUT SHORT CIRCUIT STATE | L | OFF | OFF | <Vin(ON) | ON | >Vin(ON) | short | ON | L | POWER SHORT CIRCUIT OR FAILURE |
|  |  | H | ON | ON | <Vin(ON) | ON | <Vin(ON) | short | ON | L |  |
| (6) | CIRCUIT FAILURE EXAMPLE: OPTICAL COUPLER 41 OUTPUT OPEN STATE | L | OFF | OFF | <Vin(ON) | ON | >Vin(ON) | ON | open | H | GROUND SHORT CIRCUIT OR FAILURE |
|  |  | H | ON | ON | <Vin(ON) | ON | <Vin(ON) | OFF | open | H |  |

INTERLOCK DEVICE FOR HIGH VOLTAGE APPARATUS

TECHNICAL FIELD

The present invention relates to an interlock device for detecting disconnection of a connector that connects a high voltage apparatus such as an electric compressor mounted on a vehicle, for example, to a high voltage power supply.

BACKGROUND ART

An electric compressor constituting an air conditioning device of a vehicle, for example, is connected to a high voltage power supply (HV battery) by a connector (HV connector). If the connector is disconnected, an electric shock or other accident may occur. Thus, conventionally, an interlock loop of an interlock device is annexed to the connector for detecting the disconnection of the connector.

The interlock loop attains a closed state (closed circuit) or an open state (open circuit) according to the connection or non-connection (disconnection) of the connector. It has been configured such that, with a signal at a certain level being output from the controller to the interlock loop, the non-connection (disconnection) of the connector is detected when the signal level to the controller is inverted due to the interlock loop becoming an open state (see, e.g., Patent Document 1).

CITATION LIST

Patent Documents

Patent Document 1: Japanese Patent Application Laid-Open No. 2014-11959

SUMMARY OF THE INVENTION

Problems to be Solved by the Invention

As such, the conventional interlock device is capable of detecting the disconnection of a connector. However, the device would not be able to detect the disconnection of the connector with accuracy in the event that the interlock loop is short-circuited to the power supply or to the ground or in the event that the interlock device itself fails.

The present invention has been made to solve such conventional technical problems, and an object of the present invention is to provide an interlock device for a high voltage apparatus which enables not only the diagnosis of the connected or non-connected state of the connector during normal operation of the interlock device, but also the detection of a failure of the interlock device itself, including a failure of the interlock loop.

Means for Solving the Problems

In order to solve the above-described problems, an interlock device for a high voltage apparatus according to the present invention includes: an interlock loop annexed to an HV connector for connecting a high voltage apparatus mounted on a vehicle to a high voltage power supply; a detecting signal output unit that outputs an L/H signal; a first switching element having a control electrode connected to one connection line of the interlock loop; a controlling voltage switching circuit connected to another connection line of the interlock loop and operable, in a closed state of the interlock loop, to switch a voltage applied to the control electrode of the first switching element according to an output of the detecting signal output unit; a second switching element having a control electrode connected to the other connection line of the interlock loop and a main circuit connected to the one connection line of the interlock loop, and operable, in an open state of the interlock loop, to apply to the control electrode of the first switching element an output of the controlling voltage switching circuit so as to cause an ON/OFF state of the first switching element to be inverted from when the interlock loop is in the closed state; a determining signal output circuit that outputs an L/H signal according to the state of the first switching element; and a failure diagnosis unit that diagnoses a state of the interlock loop on the basis of an output of the determining signal output circuit, the failure diagnosis unit diagnosing the state of the interlock loop from a combination of the output of the detecting signal output unit and the output of the determining signal output circuit.

The interlock device for a high voltage apparatus of the invention of claim 2 is characterized in that, in the above invention, the failure diagnosis unit diagnoses at least a connection or non-connection of the HV connector and a failure of the interlock device itself, including a failure of the interlock loop.

The interlock device for a high voltage apparatus of the invention of claim 3 is characterized in that, in each of the above inventions, the controlling voltage switching circuit consists of a resistor circuit connected to a power supply, and an insulating signal transmission element connected between the resistor circuit and the detecting signal output unit.

The interlock device for a high voltage apparatus of the invention of claim 4 is characterized in that, in each of the above inventions, the determining signal output circuit consists of an insulating signal transmission element connected between the first switching element and the failure diagnosis unit.

The interlock device for a high voltage apparatus of the invention of claim 5 is characterized in that, in each of the above inventions, the interlock device is disposed in the high voltage apparatus.

The interlock device for a high voltage apparatus of the invention of claim 6 is characterized in that, in each of the above inventions, the high voltage apparatus is an electric compressor mounted on the vehicle.

Advantageous Effect of the Invention

The interlock device for a high voltage apparatus according to the present invention includes: an interlock loop annexed to an HV connector for connecting a high voltage apparatus mounted on a vehicle to a high voltage power supply; a detecting signal output unit that outputs an L/H signal; a first switching element having a control electrode connected to one connection line of the interlock loop; a controlling voltage switching circuit connected to another connection line of the interlock loop and operable, in a closed state of the interlock loop, to switch a voltage applied to the control electrode of the first switching element according to an output of the detecting signal output unit; a second switching element having a control electrode connected to the other connection line of the interlock loop and a main circuit connected to the one connection line of the interlock loop, and operable, in an open state of the interlock loop, to apply to the control electrode of the first switching element an output of the controlling voltage switching circuit so as to cause an ON/OFF state of the first switching element to be inverted from when the interlock loop is in the closed state; and a determining signal output circuit that outputs an L/H signal according to the state of the first switching element. Accordingly, even when the output of the detecting signal output unit is the same, the voltage applied to the control electrode of the first switching element changes depending on whether the interlock loop is in the closed state or in the open state. With this, the state of the first switching element changes, and the output of the determining signal output circuit changes as well.

Further, even in the event that the interlock loop is short-circuited to the power supply or to the ground, for example, the voltage applied to the control electrode of the first switching element changes, causing the output of the determining signal output circuit to be changed. Furthermore, even in the event of a failure of the first switching element or the determining signal output circuit itself, the output of the determining signal output circuit will change as a result.

In the present invention, the device further includes a failure diagnosis unit that diagnoses a state of the interlock loop on the basis of the output of the determining signal output circuit. The failure diagnosis unit is configured to diagnose the state of the interlock loop from a combination of the output of the detecting signal output unit and the output of the determining signal output circuit. Thus, the failure diagnosis unit is capable of diagnosing the connection or non-connection of the HV connector and also the failure of the interlock device itself, including the failure of the interlock loop (the above-described power short circuit or ground short circuit), as specified in the invention of claim 2.

Accordingly, even in the event of a failure of the interlock device for a high voltage apparatus itself, including a failure of the interlock loop, it is possible to accurately diagnose the disconnection of the connector as an unsafe state (connector non-connected, failure, etc.) (without making a misdiagnosis such as the connector being in a connected state).

In particular, according to the present invention, the first and second switching elements can be used to output to the failure diagnosis unit an output used for failure diagnosis as described above. It is therefore possible to construct a low-cost circuit with a relatively small number of components by using general purpose components.

Further, the configuration in which the controlling voltage switching circuit is configured with the resistor circuit connected to a power supply and the insulating signal transmission element connected between the resistor circuit and the detecting signal output unit, as in the invention of claim 3, and in which the determining signal output circuit is configured with the insulating signal transmission element connected between the first switching element and the failure diagnosis unit, as in the invention of claim 4, allows the device to be safely insulated between the high voltage side and the low voltage side.

In particular, disposing the interlock device for a high voltage apparatus in the high voltage apparatus as in the invention of claim 5 enables the failure diagnosis to be performed on the high voltage apparatus side, as in the case of the high voltage apparatus mounted on a vehicle, for example, without the need to connect the interlock loop to a controller of the vehicle.

The above-described interlock device for a high voltage apparatus is extremely effective when applied to the electric compressor as the high voltage apparatus mounted on a vehicle as in the invention of claim 6.

BRIEF DESCRIPTION OF THE DRAWINGS

FIG. 3 is a diagram illustrating the state of the interlock loop, the voltage level at each point, and the operation or state of each element in FIG. 2.

MODE FOR CARRYING OUT THE INVENTION

Figure 1:
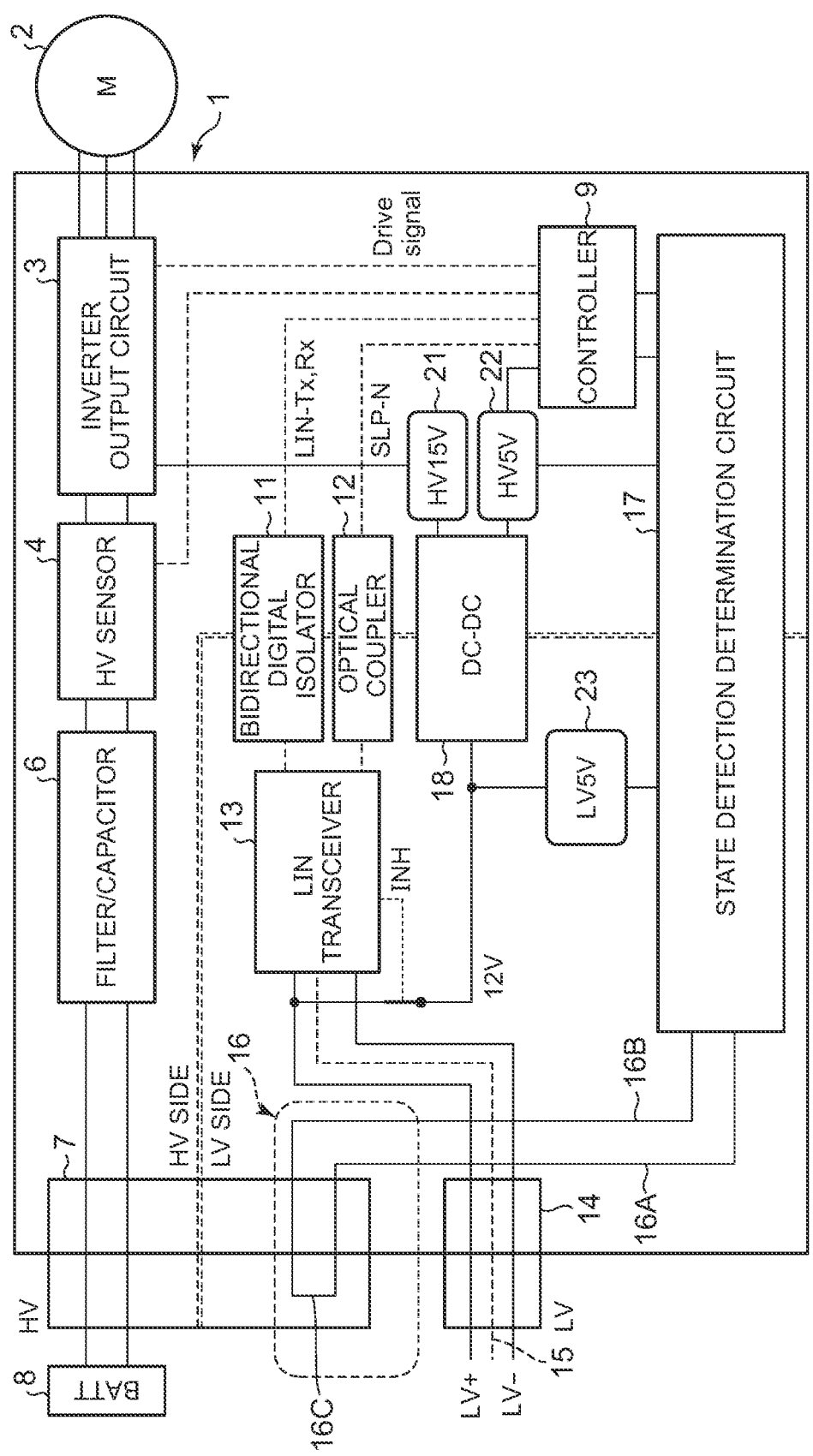
FIG. 1 is a functional block diagram of an inverter 1 for an electric compressor as an example of the high voltage apparatus to which the present invention is applied.

An embodiment of the present invention will be described in detail below with reference to the drawings. FIG. 1 shows functional blocks of an inverter 1 for an electric compressor that constitutes an air conditioning device of a vehicle as a high voltage apparatus to which the present invention is applied. In FIG. 1, reference numeral 2 denotes a motor that drives the electric compressor. The motor is driven by an inverter output circuit 3. Reference numeral 4 denotes a high voltage detection sensor and reference numeral 6 denotes a filter/capacitor, which are connected via an HV connector 7 to an HV battery 8 as a high voltage power supply mounted on the vehicle.

Reference numeral 9 denotes a controller composed of a microcomputer. The controller 9 controls the drive of the motor 2 of the electric compressor. The controller 9 is connected to a LIN transceiver 13 via a bidirectional digital isolator 11 and an optical coupler 12. The LIN transceiver 13 is connected to a controller (ECU) on the vehicle side, not shown, via a connector (LV connector) 14 and a vehicle communication bus 15. The controller 9 is connected to the inverter output circuit 3, and controls the inverter output circuit 3 by outputting a drive signal on the basis of instruction information from the controller on the vehicle side provided from the LIN transceiver 13.

Further, reference numeral 16 denotes an interlock loop, which is annexed to the HV connector 7. The interlock loop 16 consists of one connection line 16A, another connection line 16B, and a coupling line 16C connecting the connection lines 16A and 16B. The interlock loop is configured such that, when the HV connector 7 is connected, the loop is closed (closed state) with the coupling line 16C connecting the connection lines 16A and 16B, and when the HV connector 7 is not connected (disconnected), the loop is opened (open state) with the coupling line 16C disconnected from the connection lines 16A and 16B. The connection lines 16A and 16B of the interlock loop 16 are connected to a state detection determination circuit 17, and the state detection determination circuit 17 is connected to the controller 9.

A low voltage power supply LV+/LV− connected to the inverter 1 is supplied to the inverter internal circuit as a 12V power supply/LVGND. Reference numeral 18 denotes a DC-DC converter which generates a 15V power supply 21 and a 5V power supply (HV side) 22 from the 12V power supply drawn into the inverter. The 15V power supply 21 is connected to the inverter output circuit 3 and the 5V power supply (HV side) 22 is connected to the controller 9 and the state detection determination circuit 17. A 5V power supply (LV side) 23 is also connected to the state detection determination circuit 17.

A detecting signal output unit and a failure diagnosis unit of the controller 9, the interlock loop 16, and the state detection determination circuit 17 constitute the interlock device for a high voltage apparatus of the present invention. The interlock device for a high voltage apparatus of the present invention is disposed in an electric compressor (the high voltage apparatus), and the range indicated as "HV side" in the drawings means the high voltage side, and the range indicated as "LV side" means the low voltage side.

Figure 2:
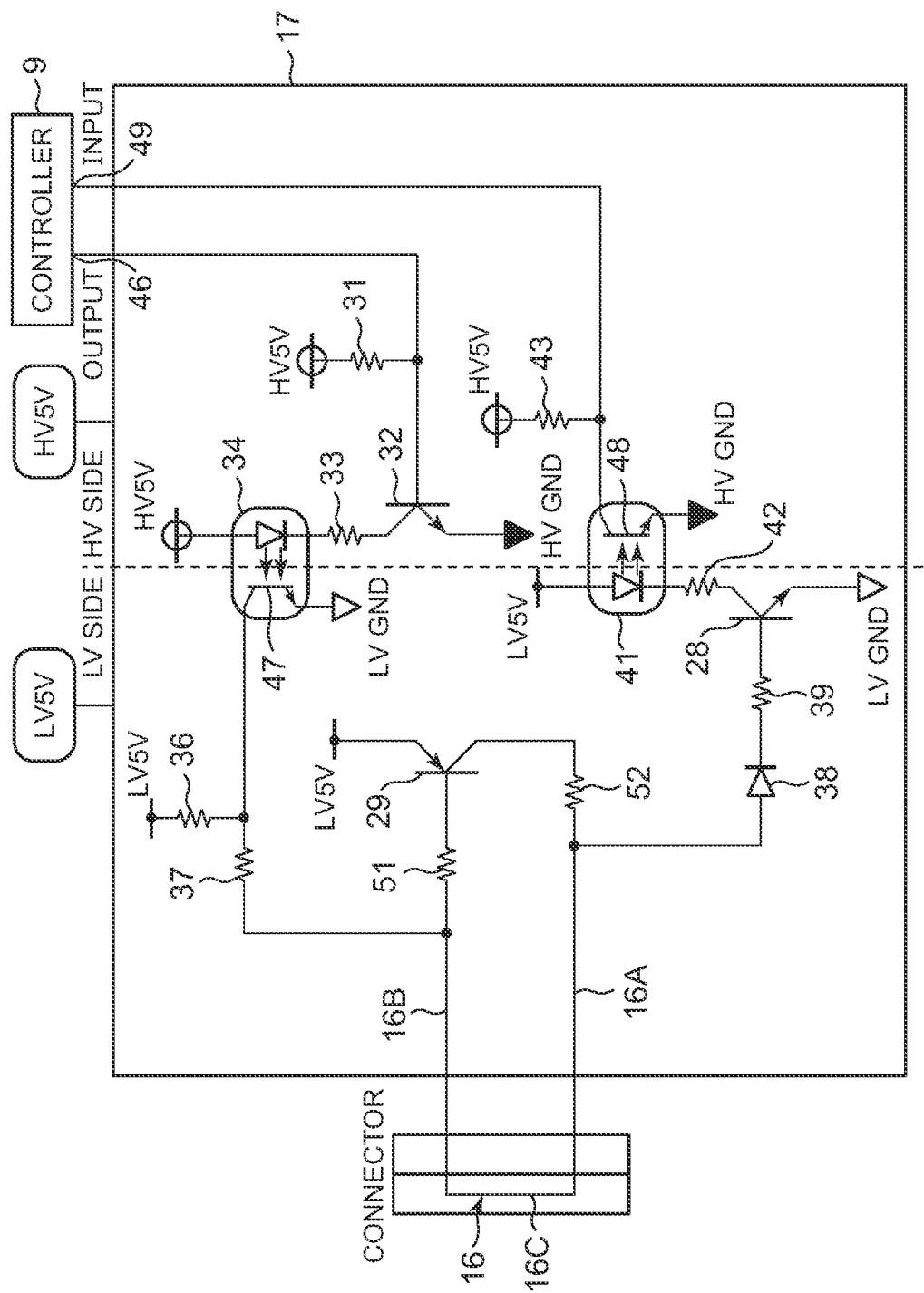
FIG. 2 is a diagram illustrating an example of an electric circuit of a state detection determination circuit 17 in FIG. 1.

Next, FIG. 2 illustrates an example of an electric circuit of the state detection determination circuit 17 in FIG. 1. The state detection determination circuit 17 of the example includes: a first switching element 28 configured with an NPN transistor; a second switching element 29 configured with a PNP transistor; a resistor 31 (pull-up resistor), a third switching element 32 (configured with an NPN transistor), a resistor 33, an optical coupler 34 as an insulating signal transmission element, a resistor 36 (pull-up resistor), a resistor 37, a diode 38, and a resistor 39, which constitute the controlling voltage switching circuit of the present invention; and an optical coupler 41 as an insulating signal transmission element, a resistor 42, and a resistor 43 (pull-up resistor), which constitute the determining signal output circuit of the present invention. The resistor 37 is a limiting resistor, which is preferably provided to protect the output of the optical coupler 34 in the event of a short circuit to the power supply. The diode 38 is preferably provided for adjusting the input ON voltage level of the first switching element 28.

In this case, the resistor 31 has one end connected to the 5V power supply 22 (HV side), and the other end of the resistor 31 is connected to a base (a control electrode) of the third switching element 32. The controller 9 has an output port 46 (OUTPUT) connected to a connection point between the resistor 31 and the base of the third switching element 32. The third switching element 32 has a collector, constituting its main circuit, connected to the 5V power supply 22 (HV side) via the resistor 33 and the optical coupler 34. An emitter of the third switching element 32, also constituting the main circuit, is connected to HVGND.

The resistor 36 has one end connected to the 5V power supply 23 (LV side). The optical coupler 34 has an output 47 connected between the other end of the resistor 36 and LVGND. The other end of the resistor 36 is connected to the other connection line 16B of the interlock loop 16 via the resistor 37. The one connection line 16A of the interlock loop 16 is connected to a base (a control electrode) of the first switching element 28 via the diode 38 and the resistor 39. That is, the optical coupler 34 is connected between a resistor circuit, composed of the resistors 36, 37, and 39, and the output port 46 (constituting the detecting signal output unit) of the controller 9.

The first switching element 28 has an emitter, constituting its main circuit, connected to LVGND. A collector of the first switching element 28, also constituting the main circuit, is connected to the 5V power supply 23 (LV side) via the resistor 42 and the optical coupler 41. The resistor 43 has one end connected to the 5V power supply 22 (HV side). The optical coupler 41 has an output 48 connected between the other end of the resistor 43 and HVGND. Then, a connection point between the resistor 43 and the output 48 of the optical coupler 41 is connected with an input port 49 (INPUT) of the controller 9.

The second switching element 29 has a base (a control electrode) connected via a resistor 51 to a connection point between the resistor 37 and the other connection line 16B of the interlock loop 16. The second switching element 29 has an emitter, constituting its main circuit, connected to the 5V power supply 23 (LV side), and a collector, also constituting the main circuit, connected via a resistor 52 to a connection point between the diode 38 and the one connection line 16A of the interlock loop 16. In the example, the resistors 51 and 52 described above constitute part of the second switching element in the present invention. The diode 38 is in the forward direction on the resistor 39 side.

As described above, the controller 9 constitutes the failure diagnosis unit and the detecting signal output unit in the present invention. The controller 9 performs failure diagnosis, described below, on the basis of the combination of an L/H signal (an input signal for determination) input from the input port 49 with respect to an L/H signal (an output signal for detection) output from the output port 46.

With the configuration described above, an operation of the interlock device for a high voltage apparatus of an example will be described below with reference to FIGS. 2 and 3. FIG. 3 shows the state of the interlock loop 16, etc., the signal levels at the output port 46 and the input port 49 of the controller 9, the operation of each element in FIG. 2, and the diagnostic result of the controller 9 based on the foregoing. In the present example, it is firstly assumed that the controller 9 alternately outputs an "L" level signal and an "H" level signal from the output port 46 at a predetermined cycle.

(1) When the Interlock Device for a High Voltage Apparatus is Normal while the HV Connector 7 is Connected It is now assumed that the HV connector 7 is connected, the loop is closed (closed state) with the coupling line 16C of the interlock loop 16 connecting the connection lines 16A and 16B, and there is no failure in the interlock loop 16 and the state detection determination circuit 17 of the interlock device for a high voltage apparatus.

In this state, when the signal output from the output port 46 is at an "L" level, the base potential of the third switching element 32 does not reach an ON level, Vin(ON), and thus, the third switching element 32 turns OFF. With this, the optical coupler 34 also turns OFF, and the output 47 is in an open state. In this state, a voltage is applied to the base of the first switching element 28 through a path of the 5V power supply 23 (LV side), the resistor 37, the connection line 16B, coupling line 16C, and connection line 16A of the interlock loop 16, the diode 38, and the resistor 39. This causes the base potential to be higher than an ON level, Vin(ON), and the first switching element 28 turns ON. With the first switching element 28 turning ON, the optical coupler 41 turns ON, with its output 48 in a closed state. This results in an "L" level signal at the input port 49 of the controller 9. It should be noted that the base potential of the second switching element 29 is lower than an ON level, Vin(ON), so the second switching element 29 is ON.

On the other hand, when the signal output from the output port is at an "H" level, the base potential of the third switching element 32 reaches the ON level, Vin(ON), and thus the third switching element 32 turns ON. With this, the optical coupler 34 also turns ON, with its output 47 in a closed state. In this state, the potential at the connection point between the resistor 36 and the resistor 37 falls to the LVGND level, so the base potential of the first switching element 28 does not reach the ON level, Vin(ON). The first switching element 28 thus turns OFF. It should be noted that the base potential of the second switching element 29 is lower than the ON level, Vin(ON), so the second switching element 29 is ON. However, the potential at the connection point between the resistor 52 and the resistor 39 does not reach the ON level, Vin (ON), of the first switching element 28. With the first switching element 28 turning OFF, the optical coupler 41 also turns OFF, with its output 48 in an open state. This results in an "H" level signal at the input port 49 of the controller 9.

When an "L" level signal output from the output port 46 results in an "L" level signal at the input port 49 and an "H" level signal output from the output port 46 results in an "H" level signal at the input port 49, then the controller 9 makes a diagnosis that the HV connector 7 is in a connected state.

(2) When the Interlock Device for a High Voltage Apparatus is Normal while the HV Connector 7 is Non-Connected (Disconnected)

Next, a description will be made about a case where the HV connector 7 becomes non-connected, the loop is opened (open state) with the coupling line 16C of the interlock loop 16 disconnected from the connection lines 16A and 16B, and there is no failure in the interlock loop 16 and the state detection determination circuit 17 of the interlock device for a high voltage apparatus.

In this state, when the signal output from the output port 46 is at an "L" level, the base potential of the third switching element 32 does not reach the ON level, Vin(ON), and thus the third switching element 32 turns OFF. With this, the optical coupler 34 also turns OFF, with its output 47 in an open state. However, with the connection line 16B and the connection line 16A of the interlock loop 16 unconnected, the above-described path of the 5V power supply 23 (LV side), the resistor 37, the connection line 16B, coupling line 16C, and connection line 16A of the interlock loop 16, the diode 38, and the resistor 39 ceases to exist. As a result, no voltage is applied to the base of the first switching element 28, and the base potential becomes lower than the ON level, Vin(ON), so the first switching element 28 turns OFF. It should be noted that the base potential of the second switching element 29 is higher than the ON level, Vin(ON), and thus the second switching element 29 is also OFF. With the first switching element 28 turning OFF, the optical coupler 41 also turns OFF, with its output 48 in an open state. This results in an "H" level signal at the input port 49 of the controller 9.

On the other hand, when the signal output from the output port is at an "H" level, the base potential of the third switching element 32 reaches the ON level, Vin(ON), and thus the third switching element 32 turns ON. With this, the optical coupler 34 also turns ON, with its output 47 in a closed state. With this, the base potential of the second switching element 29 becomes lower than the ON level, Vin(ON), and the second switching element 29 turns ON. At this time, the connection lines 16B and 16A of the interlock loop 16 are not connected. Thus, with the second switching element 29 turning ON, a voltage is applied to the base of the first switching element 28 through a path of the 5V power supply 23 (LV side), the main circuit of the second switching element 29, the resistor 52, the diode 38, and the resistor 39. This causes the base potential to be higher than the ON level, Vin (ON), and thus the first switching element 28 turns ON. With the first switching element 28 turning ON, the optical coupler 41 turns ON, with its output 48 in a closed state. This results in an "L" level signal at the input port 49 of the controller 9.

That is, when the interlock loop 16 is in an open state, the second switching element 29 acts to apply, to the base of the first switching element 28 via the diode 38 and the resistor 39 constituting the controlling voltage switching circuit (i.e., as the output of the controlling voltage switching circuit), a voltage that causes the ON/OFF state of the first switching element 28 to be inverted from when the interlock loop 16 is in a closed state in which a voltage is applied to the base of the first switching element 28 through the path of the resistor 37, the connection line 16B, coupling line 16C, and connection line 16A of the interlock loop 16, the diode 38, and the resistor 39.

When an "L" level signal output from the output port 46 results in an "H" level signal at the input port 49 and an "H" level signal output from the output port 46 results in an "L" level signal at the input port 49, then the controller 9 makes a diagnosis that the HV connector 7 is in a non-connected state.

(3) Power Short Circuit State of the Interlock Loop 16

Next, a description will be made about a case where the interlock loop 16 is short-circuited to the 5V power supply 23 (LV side) while the loop of the interlock loop 16 is in a closed state. When the interlock loop 16 is short-circuited to the 5V power supply 23 (LV side), the 5V power supply 23 (LV) is supplied to the bases of the first switching element 28 and the second switching element 29, regardless of whether the signal output from the output port 46 of the controller 9 is at an "L" level or an "H" level, and the second switching element 29 turns OFF and the first switching element 28 turns ON. With the first switching element 28 turning ON, the optical coupler 41 turns ON, with its output 48 in a closed state. This results in an "L" level signal at the input port 49 of the controller 9.

When an "L" level signal output from the output port 46 results in an "L" level signal at the input port 49 and an "H" level signal output from the output port 46 also results in an "L" level signal at the input port 49, then the controller 9 diagnoses it as a failure state (in this case, the power short circuit failure of the interlock loop 16).

(4) Ground Short Circuit State of the Interlock Loop 16

Next, a description will be made about a case where the interlock loop 16 is short-circuited to the ground (LVGND). When the interlock loop 16 is short-circuited to the ground, the base potentials of the first switching element 28 and the second switching element 29 also become the ground (LVGND) level, regardless of whether the signal output from the output port 46 of the controller 9 is at an "L" level or an "H" level, and the second switching element 29 turns ON and the first switching element 28 turns OFF. With the first switching element 28 turning OFF, the optical coupler 41 turns OFF, with its output 48 in an open state. This results in an "H" level signal at the input port 49 of the controller 9.

When an "L" level signal output from the output port 46 results in an "H" level signal at the input port 49 and an "H" level signal output from the output port 46 also results in an "H" level signal at the input port 49 as described above, the controller 9 diagnoses it as a failure state (in this case, the ground short circuit failure of the interlock loop 16).

(5) Output Short Circuit State of the First Switching Element 28 (with its Main Circuit Short-Circuited)

Next, a description will be made, as another failure example, about a case where the main circuit of the first switching element 28 is short-circuited. When the main circuit of the first switching element 28 is short-circuited, the first switching element 28 attains an ON state, regardless of whether the signal output from the output port 46 of the controller 9 is at an "L" level or an "H" level. Thus, the optical coupler 41 turns ON, with its output 48 in a closed state. This results in an "L" level signal at the input port 49 of the controller 9.

When an "L" level signal output from the output port 46 results in an "L" level signal at the input port 49 and an "H" level signal output from the output port 46 also results in an "L" level signal at the input port 49 as described above, the controller 9 diagnoses it as a failure state (in this case, the output short circuit failure of the first switching element 28).

(6) Output Open State of the Optical Coupler 41

Next, a description will be made, as yet another failure example, about a case where the output 48 of the optical coupler 41 ceases to be closed (or, it remains open). When the output 48 of the optical coupler 41 is in an open state, the signal at the input port 49 of the controller 9 is at an "H" level, regardless of whether the signal output from the output port 46 of the controller 9 is at an "L" level or an "H" level.

When an "L" level signal output from the output port 46 results in an "H" level signal at the input port 49 and an "H" level signal output from the output port 46 also results in an "H" level signal at the input port 49 as described above, the controller 9 diagnoses it as a failure state (in this case, the open failure of the output 48 of the optical coupler 41).

As described in detail above, the interlock device for a high voltage apparatus of the present invention includes: the interlock loop 16 that is annexed to the HV connector 7 for connecting the electric compressor (the high voltage apparatus) mounted on a vehicle to the HV battery 8 (the high voltage power supply); the detecting signal output unit that outputs an L/H signal; the first switching element 28 having a base connected to the one connection line 16A of the interlock loop 16; the controlling voltage switching circuit connected to the other connection line 16B of the interlock loop 16 and operable, in the closed state of the interlock loop 16, to switch a voltage applied to the base of the first switching element 28 according to the output of the detecting signal output unit; the second switching element 29 having a base connected to the other connection line 16B of the interlock loop 16 and a main circuit connected to the one connection line 16A of the interlock loop 16, and operable, in the open state of the interlock loop 16, to apply to the base of the first switching element 28 an output of the controlling voltage switching circuit so as to cause an ON/OFF state of the first switching element 28 to be inverted from when the interlock loop 16 is in the closed state; and the determining signal output circuit that outputs an L/H signal according to the state of the first switching element 28. Accordingly, even if the output of the detecting signal output unit (i.e., the output port 46 of the controller 9) is the same, the voltage applied to the base of the first switching element 28 changes depending on whether the interlock loop 16 is in the closed state or the open state. With this, the state of the first switching element 28 changes, and the output of the determining signal output circuit also changes.

Further, even in the event that the interlock loop 16 is short-circuited to the power supply or to the ground, the voltage applied to the base of the first switching element 28 changes, causing the output of the determining signal output circuit to be changed. Furthermore, even in the event of a failure of the first switching element 28 or the determining signal output circuit (the optical coupler 41) itself, the output of the determining signal output circuit will change as a result.

In the present invention, the device includes the failure diagnosis unit (the controller 9) that diagnoses the state of the interlock loop 16 on the basis of the output of the determining signal output circuit. The failure diagnosis unit diagnoses the state of the interlock loop 16 from the combination of the output of the detecting signal output unit (the output port 46) and the output of the determining signal output circuit (the input port 49). The failure diagnosis unit is thus able to diagnose the connection or non-connection of the HV connector 7 and also the failure of the interlock device itself, including the failure of the interlock loop 16 (the power short circuit or the ground short circuit described above).

Accordingly, even in the event of a failure of the interlock device for a high voltage apparatus itself, including a failure of the interlock loop 16, it is possible to accurately diagnose the disconnection of the HV connector 7 as an unsafe state (connector non-connected, failure, etc.) (without making a misdiagnosis such as the connector being in a connected state, etc.)

In particular, according to the present invention, the first and second switching elements 28, 29 can be used to output to the failure diagnosis unit the output used for failure diagnosis as described above. It is thus possible to construct a low-cost circuit with a relatively small number of components by using general purpose components.

Further, the configuration as in the example in which the controlling voltage switching circuit is configured with the resistor circuit composed of the resistors 36, 37, and 39 connected to the 5V power supply 23 (LV side) and the optical coupler 34 connected between the resistor circuit and the detecting signal output unit (the output port 46) and in which the determining signal output circuit is configured with the optical coupler 41 connected between the first switching element 28 and the failure diagnosis unit (the controller 9) enables the device to be safely insulated between the high voltage side (HV side) and the low voltage side (LV side).

In particular, disposing the interlock device for a high voltage apparatus in the electric compressor (the high voltage apparatus) as in the example allows the failure diagnosis to be performed on the electric compressor side, without the need to connect the interlock loop 16 to a controller of the vehicle.

In the example, the interlock device for a high voltage apparatus has been applied to the electric compressor as the high voltage apparatus mounted on a vehicle. However, not limited thereto, the present invention is effective for various high voltage apparatuses mounted on a vehicle.

Further, in the example, failures of the first switching element 28 and the optical coupler 41 have been taken up as a failure of the state detection determination circuit 17. However, failure diagnosis of other elements is also possible. Further, in the example, the first switching element 28 is composed of an NPN transistor and the second switching element 29 is composed of a PNP transistor. However, not limited thereto, they may be composed of other semiconductor switching elements such as MOS-FETs, for example.

Furthermore, although the optical couplers 34 and 41 have been adopted as the insulating signal transmission elements in the example, not limited thereto, they may be configured with a digital isolator or the like. In the example, the power supply voltage on the low voltage side (LV side) has been set to 5 V. However, not limited thereto, any voltage within the LV+ power input voltage range specified by the inverter is permissible as a voltage that allows the present interlock device to function normally.

DESCRIPTION OF REFERENCE NUMERALS

1: inverter for electric compressor
2: motor
3: inverter output circuit
7: HV connector
8: HV battery (high voltage power supply)
9: controller (failure diagnosis unit, detecting signal output unit)

16: interlock loop
16A, 16B: connection line
17: state detection determination circuit
28: first switching element
29: second switching element
34: optical coupler (insulating signal transmission element, controlling voltage switching circuit)
36, 37, 39: resistor (controlling voltage switching circuit)
41: optical coupler (insulating signal transmission element, determining signal output circuit)
46: output port
49: input port

The invention claimed is:

1. An interlock device for a high voltage apparatus mounted on a vehicle, the device comprising:
an interlock loop annexed to a high voltage (HV) connector for connecting the high voltage apparatus to a high voltage power supply;
a detecting signal output unit that outputs an L/H signal;
a first switching element having a control electrode connected to one connection line of the interlock loop;
a controlling voltage switching circuit connected to another connection line of the interlock loop and operable, in a closed state of the interlock loop, to switch a voltage applied to the control electrode of the first switching element according to an output of the detecting signal output unit;
a second switching element having a control electrode connected to the other connection line of the interlock loop and a main circuit connected to the one connection line of the interlock loop, and operable, in an open state of the interlock loop, to apply to the control electrode of the first switching element an output of the controlling voltage switching circuit so as to cause an ON/OFF state of the first switching element to be inverted from when the interlock loop is in the closed state;
a determining signal output circuit that outputs an L/H signal according to the state of the first switching element; and
a failure diagnosis unit that diagnoses a state of the interlock loop on the basis of an output of the determining signal output circuit,
the failure diagnosis unit diagnosing the state of the interlock loop from a combination of the output of the detecting signal output unit and the output of the determining signal output circuit.

2. The interlock device for a high voltage apparatus according to claim 1, wherein the failure diagnosis unit diagnoses at least a connection or non-connection of the HV connector and a failure of the interlock device itself, including a failure of the interlock loop.

3. The interlock device for a high voltage apparatus according to claim 1, wherein the controlling voltage switching circuit consists of a resistor circuit connected to a power supply, and an insulating signal transmission element connected between the resistor circuit and the detecting signal output unit.

4. The interlock device for a high voltage apparatus according to claim 1, wherein the determining signal output circuit consists of an insulating signal transmission element connected between the first switching element and the failure diagnosis unit.

5. The interlock device for a high voltage apparatus according to claim 1, wherein the interlock device is disposed in the high voltage apparatus.

6. The interlock device for a high voltage apparatus according to claim 1, wherein the high voltage apparatus is an electric compressor mounted on the vehicle.

7. The interlock device for a high voltage apparatus according to claim 2, wherein the controlling voltage switching circuit consists of a resistor circuit connected to a power supply, and an insulating signal transmission element connected between the resistor circuit and the detecting signal output unit.

8. The interlock device for a high voltage apparatus according to claim 2, wherein the determining signal output circuit consists of an insulating signal transmission element connected between the first switching element and the failure diagnosis unit.

9. The interlock device for a high voltage apparatus according to claim 3, wherein the determining signal output circuit consists of an insulating signal transmission element connected between the first switching element and the failure diagnosis unit.

10. The interlock device for a high voltage apparatus according to claim 2, wherein the interlock device is disposed in the high voltage apparatus.

11. The interlock device for a high voltage apparatus according to claim 3, wherein the interlock device is disposed in the high voltage apparatus.

12. The interlock device for a high voltage apparatus according to claim 4, wherein the interlock device is disposed in the high voltage apparatus.

13. The interlock device for a high voltage apparatus according to claim 2, wherein the high voltage apparatus is an electric compressor mounted on the vehicle.

14. The interlock device for a high voltage apparatus according to claim 3, wherein the high voltage apparatus is an electric compressor mounted on the vehicle.

15. The interlock device for a high voltage apparatus according to claim 4, wherein the high voltage apparatus is an electric compressor mounted on the vehicle.

16. The interlock device for a high voltage apparatus according to claim 5, wherein the high voltage apparatus is an electric compressor mounted on the vehicle.

* * * * *